United States Patent [19]
Winters

[11] Patent Number: 5,862,457
[45] Date of Patent: Jan. 19, 1999

[54] MULTICHANNEL PREDISTORTION LINEARIZER

[75] Inventor: Jack H. Winters, Middletown, N.J.

[73] Assignee: Lucent Technologies, Inc., Murray Hill, N.J.

[21] Appl. No.: 576,421

[22] Filed: Dec. 21, 1995

[51] Int. Cl.⁶ .................................. H04B 1/02; H04B 1/04
[52] U.S. Cl. .......................... 455/103; 455/115; 455/127
[58] Field of Search ..................................... 455/103, 116, 455/119, 122, 115, 126, 17, 13.4, 113, 127; 332/160, 151; 375/296, 297

[56] References Cited

U.S. PATENT DOCUMENTS

| | | | |
|---|---|---|---|
| 4,698,597 | 10/1987 | Merli et al. .............................. | 328/163 |
| 4,991,212 | 2/1991 | Foti . | |
| 5,045,799 | 9/1991 | Holecek ..................................... | 328/14 |
| 5,125,100 | 6/1992 | Katznelson ................................ | 455/6.1 |
| 5,524,286 | 6/1996 | Chiesa et al. ............................ | 455/126 |

*Primary Examiner*—Andrew I. Faile
*Assistant Examiner*—Christopher Onuaku
*Attorney, Agent, or Firm*—Henry I. Schanzer

[57] ABSTRACT

A multiplicity of baseband input signals are supplied to a signal processor which functions to modify the input signals such that when the modified signals modulate corresponding multiple carrier wave signals which are combined to produce a composite signal which is applied to the input of an amplifier, the "peaking" at the input to the amplifier and the resultant intermodulation at the output of the amplifier are reduced. In response to the application of the baseband input signals, the signal processor determines the extent of peaking and modifies at least one of the phase and amplitude of the input signals. In one embodiment of the invention, a block of data representing the input signals over a time slot is supplied to the signal processor which then generates a fixed phase shift over the time slot. In another embodiment of the invention, a block of data representing input signals is applied to a signal processor which then determines the worst case peaking and the time of their occurrence. The signal processor then generates phase shifts which change very gradually, thereby reducing sharp peaking at the input to the amplifier at selected times without significantly distorting the signal.

13 Claims, 8 Drawing Sheets

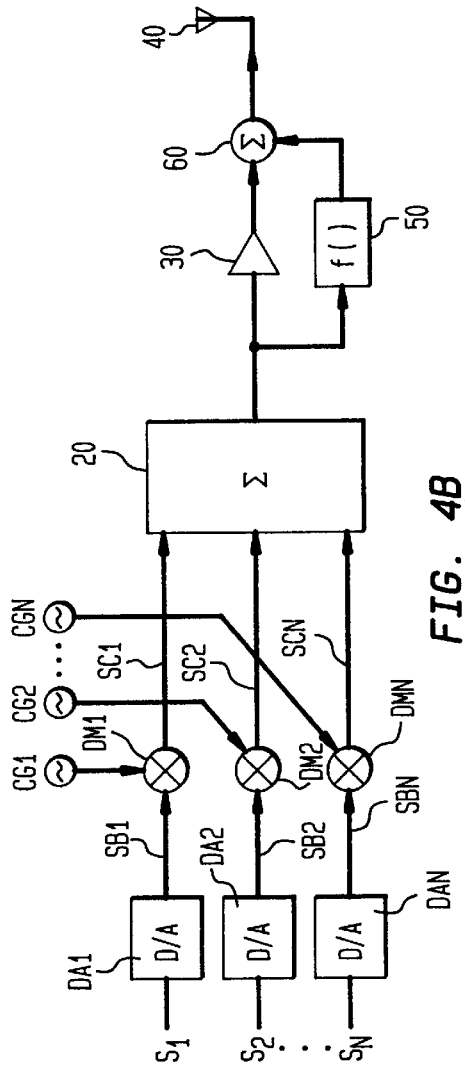
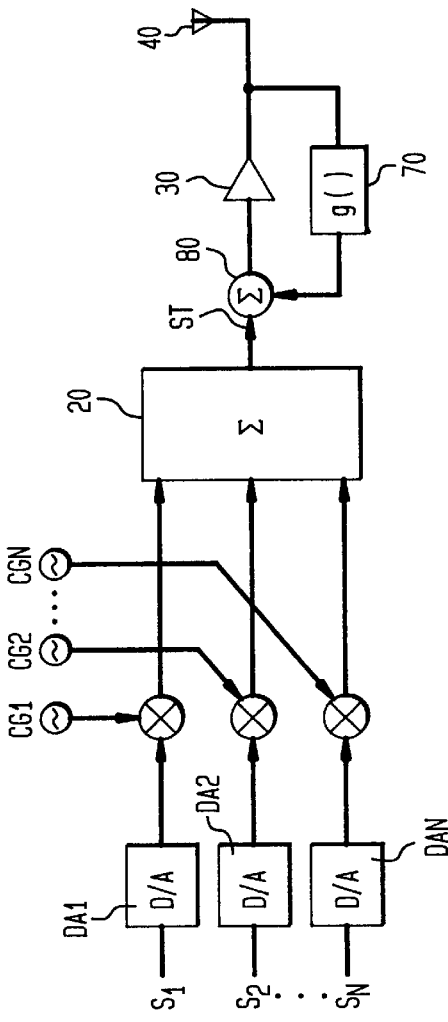
FIG. 4A (PRIOR ART)
FIG. 4B (PRIOR ART)

MULTICHANNEL PREDISTORTION LINEARIZER

FIELD OF THE INVENTION

This invention relates to means and methods for reducing intermodulation products resulting from multiple carriers being coupled to an amplifier, such as in a wireless telecommunication system.

BACKGROUND OF THE INVENTION

In wireless telecommunication systems multiple carriers are coupled to an amplifier whose output is connected to an antenna for transmission. A conventional system is shown in FIG. 1 which shows three of N (S1, S2, SN) signals coupled to respective digital-to-analog converters (DACs) identified as DA1, DA2 and DAN. The output (SBi) of each DAC is coupled to an input of a respective modulator (MDi). Each modulator (MDi) has another input coupled to a corresponding carrier wave generator (CGi). The outputs (SC1, SC2, SCN) of the modulators are then supplied to summing network 20 for combining the SCi signals. The output of summer 20 is applied to the input of power amplifier 30 whose output is supplied to antenna 40 for transmission. Amplifier 30 amplifies and transmits these multiple modulated carriers (e.g., SC1, SC2, SCN). Amplifier 30 will generate unacceptably high intermodulation products (because of amplifier nonlinearity and peaking) unless amplifier 30 is operated with an average output power which is considerably less than the maximum output power. A problem with operating amplifier 30 significantly below its maximum power capability is that it results in an undesirable loss in efficiency.

Where multiple carriers are coupled to the input of an amplifier, intermodulation occurs at the amplifier output because of two factors: (1) amplifier nonlinearity; and (2) "peaking" of the carrier signals.

The gain of an amplifier is nonlinear because the amplifier has a maximum output power and the amplifier saturates as its output power gets closer to its maximum, as shown in transfer characteristic A of FIG. 2. Typically, the output power of the amplifier is modelled as the error function of the input power. This nonlinear characteristic of the amplifier results primarily in third order intermodulation products which become larger as the amplifier output power approaches saturation. If the amplifier characteristic is known, then based on the input signal power, the amplifier response power of the signal into the amplifier can be adjusted to linearize the amplifier up to the peak output power, i.e., the amplifier can approximate an ideal limiting amplifier having a transfer characteristic of the type shown as B of FIG. 2.

The response of the amplifier due to its nonlinearity problem is greatly affected by "peaking". "Peaking" as used herein refers to the phase alignment of the multiple carrier signals such that there is addition of the amplitude of the input signals, as shown in FIG. 3A. With phase alignment of the multiple carrier modulated input signals to the amplifier, the "peak" input signal power can be many times greater than the "average" input signal power. Due to amplifier nonlinearity, when peaking occurs, the intermodulation of the signals produced at the output of the amplifier is exacerbated.

For example, consider N carrier input signals applied to an amplifier, each carrier having a maximum amplitude into the amplifier of one (1). The average power of each input signal is then ½, and the total input power into the amplifier averaged over all possible phases for these N signals is N/2. However, if all the signals are aligned in phase, then the "total" input signal amplitude of the N signals is N and the input power is $N^2/2$. Thus, the phase alignment of the carrier input signals, i.e., "peaking", can increase the input signal power by up to N times. Without any correction for peaking, the amplifier must operate at an average output power of 1/N of its maximum output power to avoid peaking and resultant intermoduation; this condition is highly inefficient.

A known method to reduce intermodulation includes a feedforward, postcompensation technique outlined in FIG. 4A. As illustrated in FIG. 4A, based on the combined input signal to amplifier 30, a signal is generated via analog network 50 that is subtracted from the amplifier output in summer 60 to significantly reduce intermodulation. This technique can typically permit the average input power to be within 5 dB of the peak input power of the amplifier with acceptable intermodulation, but requires extensive analog circuitry in networks 50 and 60 and is very sensitive to amplifier gain variation.

Another method to reduce intermodulation, employs a feedback precompensation technique, illustrated in FIG. 4B. Based on the output signal, a feedback signal is generated via feedback network 70 that is added via summer 80 to the combined input signal (ST) to reduce the joint effect of peaking and amplifier nonlinearity.

The systems shown in FIGS. 4A and 4B can be used to reduce intermodulation resulting from amplifier nonlinearity and from the input signal peaking. However, the prior art systems of FIGS. 4A and 4B require analog circuitry which can be costly. They also require significant power and hardware, and are dependent on the accuracy of the analog circuitry, which is highly undesirable. Consequently, the performance of other approaches needs to be investigated to reduce the problem of intermodulation.

In an article entitled *Some Properties of Multiple Carriers and Intermodulation* by Michael J. Gans, pp. 883–886, IEEE Vehicular Technology Conference, '93 ("Gans"), it is shown that by providing a fixed phase adjustment to a large number of unmodulated carriers coupled to an amplifier, the amplifier can be operated at an average power which is within 3 dB of the maximum power. However, it is harder to "depeak" (i.e., reduce the "peaking" of) the output signal if there are fewer unmodulated carriers. Hence, this value (i.e., 3 dB) increases with fewer carriers. By way of example, with 7 carriers the average power is only within 4 dB of the maximum power.

More importantly, Gans teaches using fixed phase adjustments where the input signals to the system are unmodulated. Referring to FIG. 1, for purpose of illustration, this means that the values of S1 through SN would be held constant and fixed phase adjustments made for the carrier signals to reduce peaking.

SUMMARY OF THE INVENTION

In an illustrative system embodying the invention, N baseband input signals are applied to a signal processing means which functions to examine the amplitude and phase of all of the N baseband input signals and, in response thereto, modifies at least one of the amplitude and phase of the N baseband signals to produce N modified signals corresponding to the N baseband input signals. The N modified signals are then coupled to the input of a power amplifier to produce, at its output, N output signals having a lower degree of intermodulation and/or distortion than would be produced by coupling the N unmodified signals to the input of the amplifier, as in the conventional systems.

In an illustrative embodiment, the signal processing means is a digital signal processor (DSP) for digitally modifying the N baseband input signals. In a further embodiment, the signal processing means generates different weighting signals for modifying the baseband input signals. Thus, in this further embodiment of the invention, baseband signals are digitally processed and modified via an input signal processor which generates weights to adjust at least one of the following: (a) their phases to reduce "peaking"; and (b) their amplitudes to improve amplifier linearization.

An aspect of the invention resides in the addition of phase shifts to the input signals without adding undesirable modulation which would cause significant distortion of the signals being propagated.

One method for adding phase shift without introduction of significant distortion calls for adjusting the phase shift once per time slot in burst mode communication systems. In this method a block of data to be transmitted over a time slot is accumulated in a signal processor (or in an associated memory, or a register bank), whereby the symbols for all the input signals over the entire time slot are known. Where the frequency and phase of the carrier wave signals are known, and where the parameters of the transmission system are also known, and where the initial phase shift of each signal at the start of each time slot is arbitrary, the phase shift for the time slot can be adjusted and set to reduce peaking over the time slot. This method is particularly useful for differential phase shift keyed modulation with differential detection with framed data, as in the North American digital mobile radio standard IS-54, where the symbols are transmitted in time slots. Since all the symbols over the time slot are known, the initial phases of the signals in each time slot can be adjusted to significantly reduce or eliminate a peak (assuming the peaking is sparse) or to reduce the maximum peaking over the time slot.

In another method, a phase shift is added to the baseband signal slowly over a long interval, i.e., a small phase shift per symbol, to eliminate different peaking events (again assuming that peaking events are sparse). The phase shifts are made small enough so as to have little effect on the received signal detection, e.g., a few degrees per symbol with digital modulation. This method is particularly useful for both analog FM (AMPS), as in analog mobile radio systems, and digital signals.

Either of these two methods, or a combination of the two, allows the phase adjustment to be time varying as required for modulated signals. These methods are preferably implemented using digital techniques and circuits; however, analog techniques or circuits may also be used.

BRIEF DESCRIPTION OF THE DRAWING

In the accompanying figures like reference characters denote like components, and;

FIGS. 4A and 4B are simplified block diagrams of amplifier arrangements in accordance with the prior art;

DETAILED DESCRIPTION OF THE INVENTION

Figure 5:
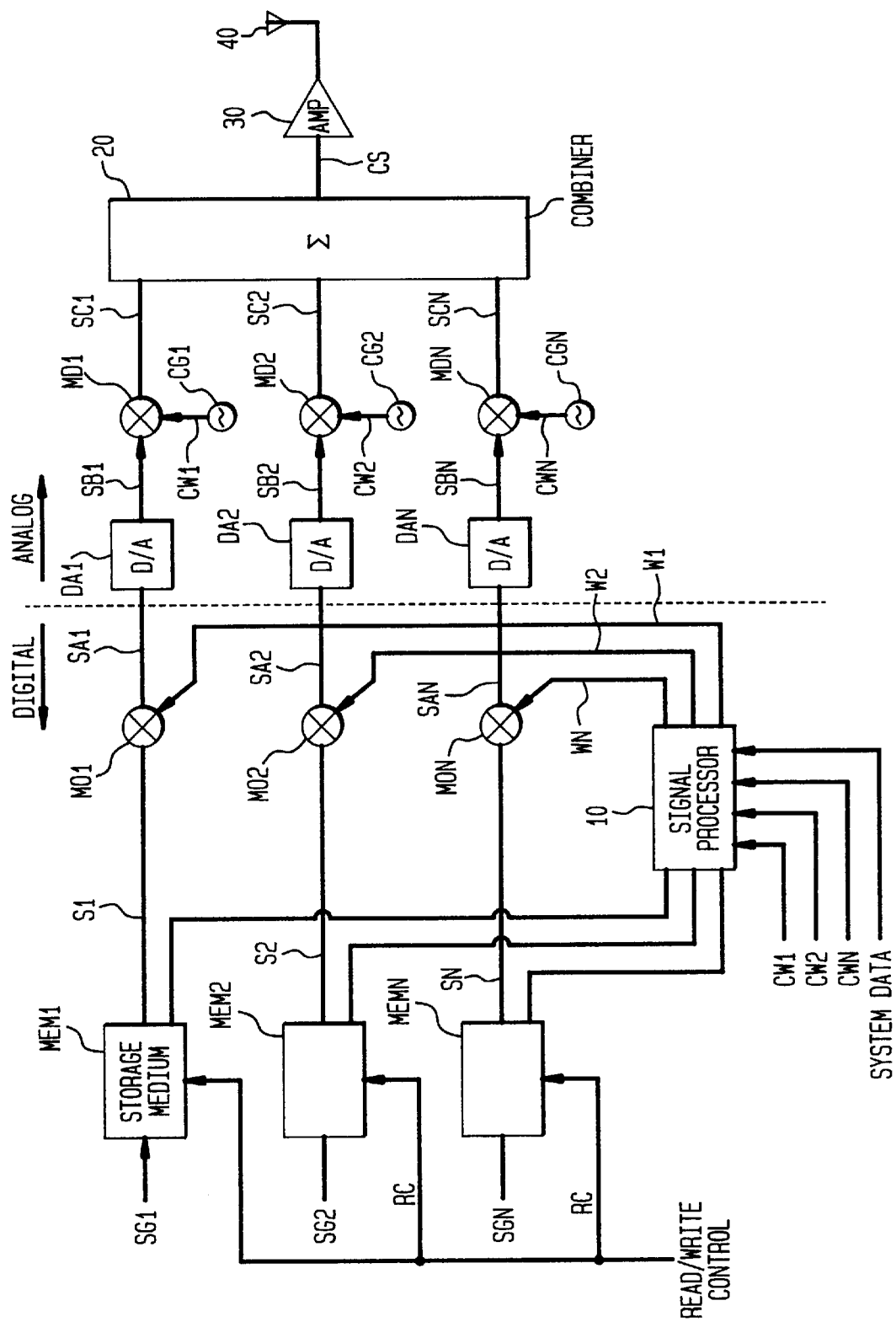
FIG. 5 is a block diagram of an amplifier system in accordance with the invention.

In FIG. 5, baseband input signals (SG1 through SGN) which are generated digitally, as is the trend in mobile radio, are supplied to corresponding storage elements MEM1 through MEMN so as to be available for digital signal processing and phase adjustment for peaking, as well as amplitude adjustment for amplifier linearization. This can be done digitally by coupling the contents of the storage elements to signal processor 10. FIG. 5 shows circuits for performing phase and amplitude adjustment using only digital signal processing; no analog circuitry is required. [However, note that analog circuitry also may be used to perform the phase and amplitude adjustments.] Furthermore, as discussed below, the phase shifts are added without adding undesirable modulation to the signals.

In FIG. 5, blocks of signal data corresponding to N input signals (S1 through SN) are supplied to a signal processor 10 designed to produce "weights" to multiply the input signals S1 through SN and to produce modified signals SA1 through SAN. Signals S1 through SN may be baseband representations of signals to be transmitted. These signals may be any standard baseband communication signals having suitable form and format for processing.

Information concerning carrier signals (CW1 through CWN) produced by carrier generators CG1 through CGN is supplied to signal processor 10 to provide signal processor 10 with information pertaining to the frequency and phase of the carrier signals.

In FIG. 5, each one of baseband digital signals S1 through SN is supplied to a corresponding multiplier MO1 through MON. Concurrently, signal processor 10, as described below, generates digital weight signals, W1 through WN which are also applied to their corresponding multipliers (MOi) to produce "modified" signals SA1 through SAN. Signal processor 10 may be, for example, a digital signal processor (DSP) such as the AT&T 32C processor or the Texas Instrument C40 processor or any like high speed processor.

The digital weight signals (W1 through WN) are developed to adjust the phases of baseband digital signals S1 through SN, e.g., by adding a phase shift, to reduce peaking in a composite signal which is generated at the input to the amplifier 30 located at a further point along the propagation path. Signal processor 10 produces a digital weight signal (Wi) for each of baseband digital signals Si. Each digital weight signal (Wi) is applied to a corresponding multiplier MOi (e.g., identified by the same suffix in FIG. 5) to modify its corresponding baseband digital signals Si and produce a corresponding modified signal SAi whose phase and amplitude is adjusted to avoid occurrence of peaking at the input to an amplifier.

The outputs SA1 through SAN of modifiers MO1 through MON are supplied to respective digital to analog (D/A) converters DA1 through DAN to produce analog signals SBi corresponding to baseband input signals Si.

The analog output signal (SBi) of each digital to analog converter (DAi) is supplied as an input to a corresponding modulator MDi. Each modulator, MDi, is also supplied with a carrier signal CWi; e.g., a radio frequency uplink carrier signal, generated by the respective corresponding one of carrier signal generators CG1 through CGN. Each one of carrier signal generators CGi is a phase locked oscillator and each one of the carrier signals CWi is generated to have a different frequency. Each analog output signal (SBi) modulates the carrier signal (CWi) of the modulator MDi to which it is connected to produce a signal SCi which is a carrier signal modulated by an analog signal derived from a corresponding modified signal SAi.

Each one of signals SCi, which corresponds to a signal Si, is supplied to combiner 20. Combiner 20 combines the modulated signals SCi into a composite signal (CS) which is supplied to amplifier 30. Amplifier 30 amplifies the composite signal comprising a combination of all the modulated signals SCi and supplies an amplified composite signal (ACS) to antenna 40 for transmission.

Figure 6A:
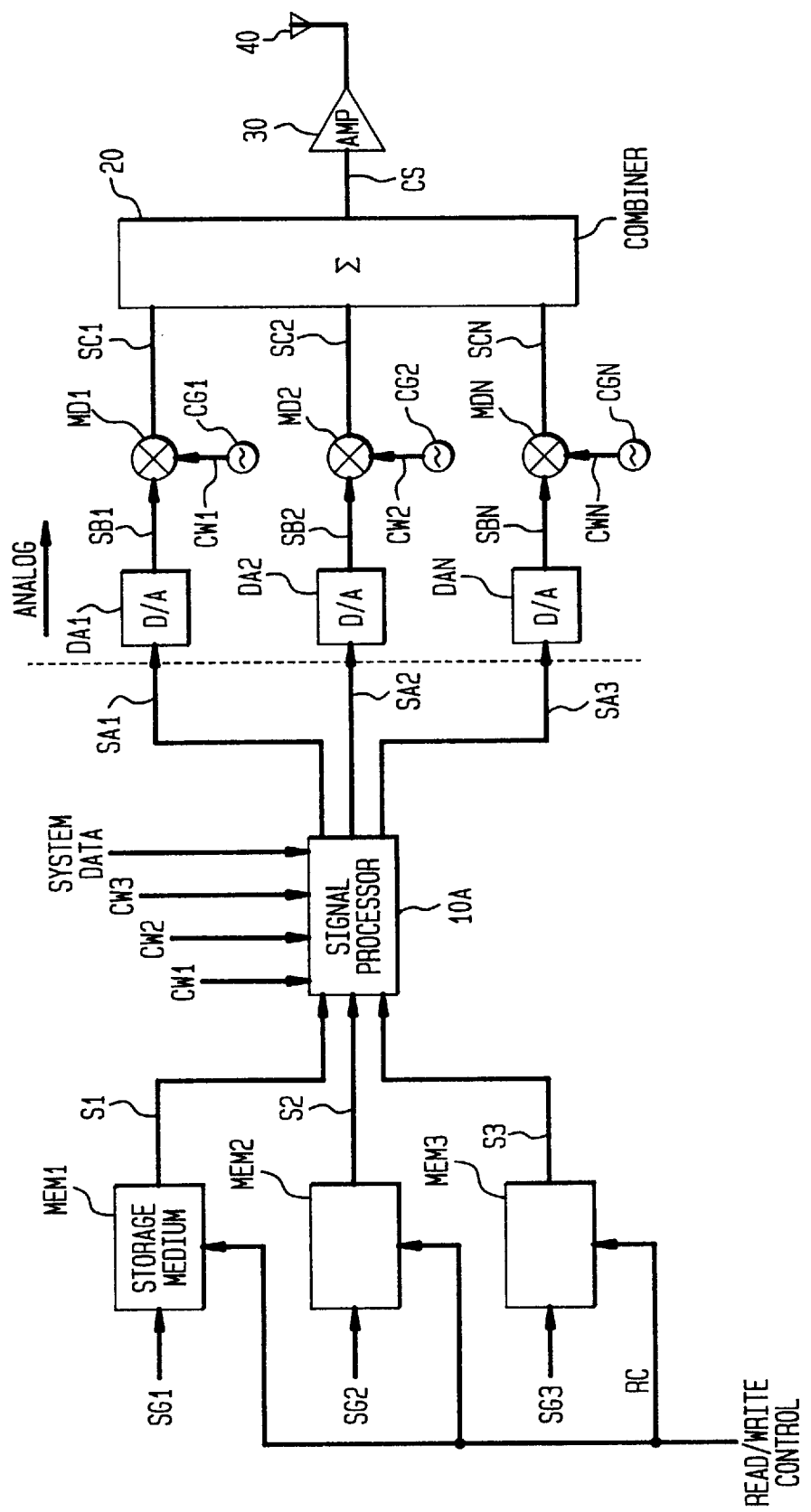
FIGS. 6A and 6B are block diagrams of other systems embodying the invention.
Figure 6B:
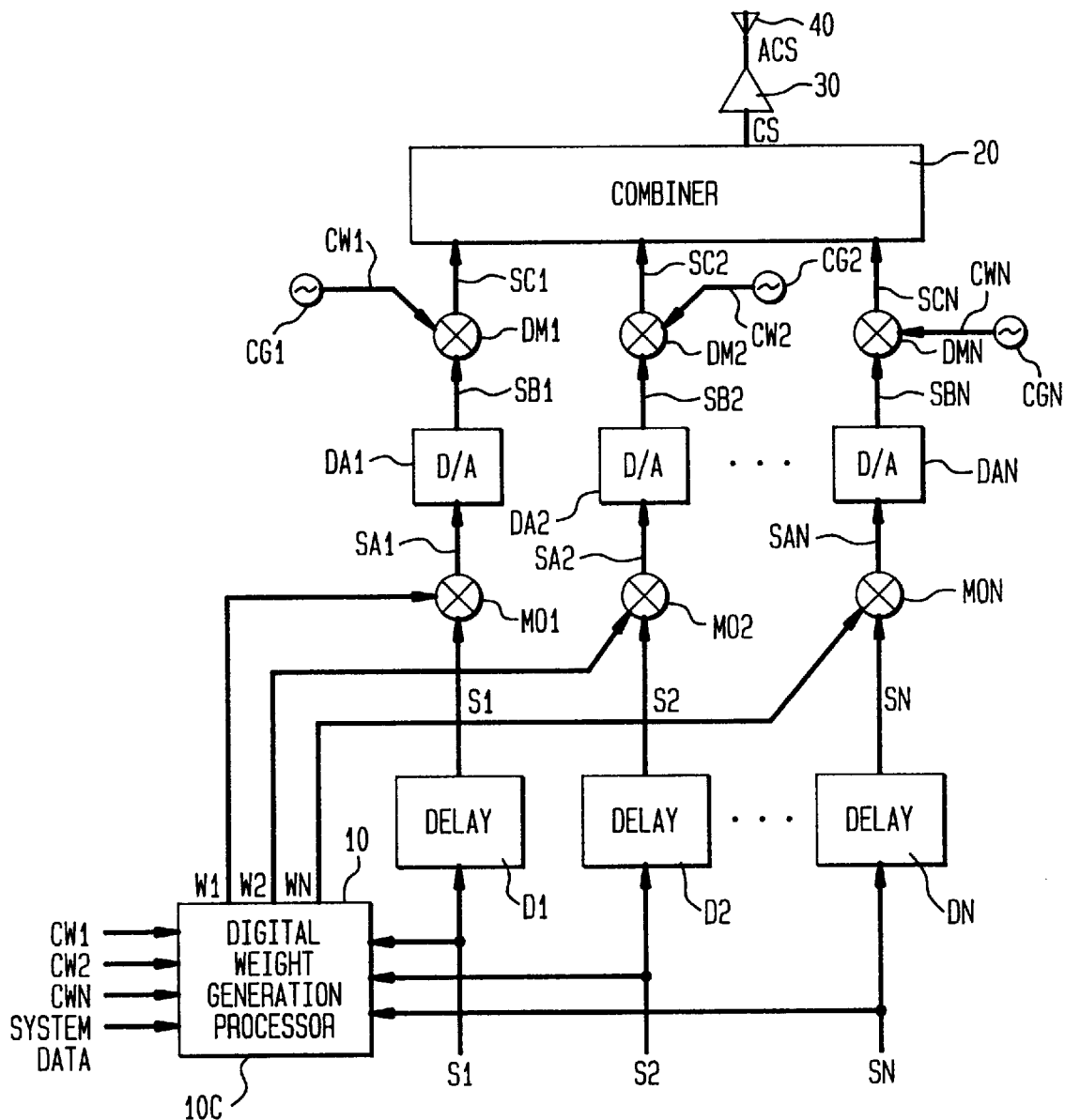

In systems embodying the invention, the application of the baseband input signals to a digital signal processor and the production of modified signals SAi may take several different forms, as shown in FIGS. 6A and 6B.

FIG. 6A illustrates that the baseband input signals SGi are read into respective memory sections MEMi and then corresponding signal samples Si are supplied to a signal processor 10a which functions to determine the desired phase and amplitude modification to be imposed on the Si signals to produce "modified" SAi signals supplied to their respective DAi's. Thus, in FIG. 6A the modification (e.g., by multiplication) of the input signals is performed in the signal processor.

FIG. 6B illustrates that the signals Si may be coupled to a processor 10c and to respective delay lines Di. The processor 10c performs all needed calculations while the data flows through the delay lines. The flow of data and the production of weighing factors corresponding to the data is synchronized to produce appropriately modified signals SAi at the output of modifiers MOi.

As shown in FIGS. 6A and 6B, signal processor 10 operates on blocks of signal data (to be subsequently transmitted during selected time periods) which are stored in storage elements MEM1 through MEMN or, alternatively, directly supplied to signal processor 10. Also, there is stored in, or made available to, signal processor 10 information pertaining to the frequency and phase of the carrier signals which is related, in time, to the blocks of signal data on which signal processor 10 operates. Hence, signal processor 10 includes means for ascertaining the symbol (or signal sample) of each "unmodified" baseband input signal (S1 through SN) to determine its amplitude and phase.

Also, there is stored in, or made available to, signal processor 10 information pertaining to the transfer characteristics of digital to analog converters (DAi), modulators (MDi), combiner 20, and amplifier 30. Hence, signal processor 10 is supplied with the information for determining the effect, at selected instants of time, of applying all the unmodified signals to the input of amplifier 30. That is, knowing the transfer function of the D/A converters (DAi's) and the response of the modulators (MDi's) and the function of the combiner circuit 20, the processor can determine the nature, phase and amplitude of the composite signal applied at the input to amplifier 30. Based on this knowledge, signal processor 10 is used to adjust the amplitude and phases of the "unmodified" signals S1 through SN to produce "modified" signals SA1, SA2, SAN.

The phases and amplitudes of the "unmodified" signals (Si) are adjusted to produce "modified" signals SAi so as to reduce "peaking" of the composite signal at the input of amplifier 30 and the resultant intermodulation products at the output of amplifier 30. The adjustment or modification of signals Si may take several different forms. However, care must be taken to ensure that the adjustment (changes or modifications) of the signals does not introduce unacceptable distortion in the signal being propagated and eventually received. Two illustrative methods of adjusting phase shifts are discussed below.

Figure 1:
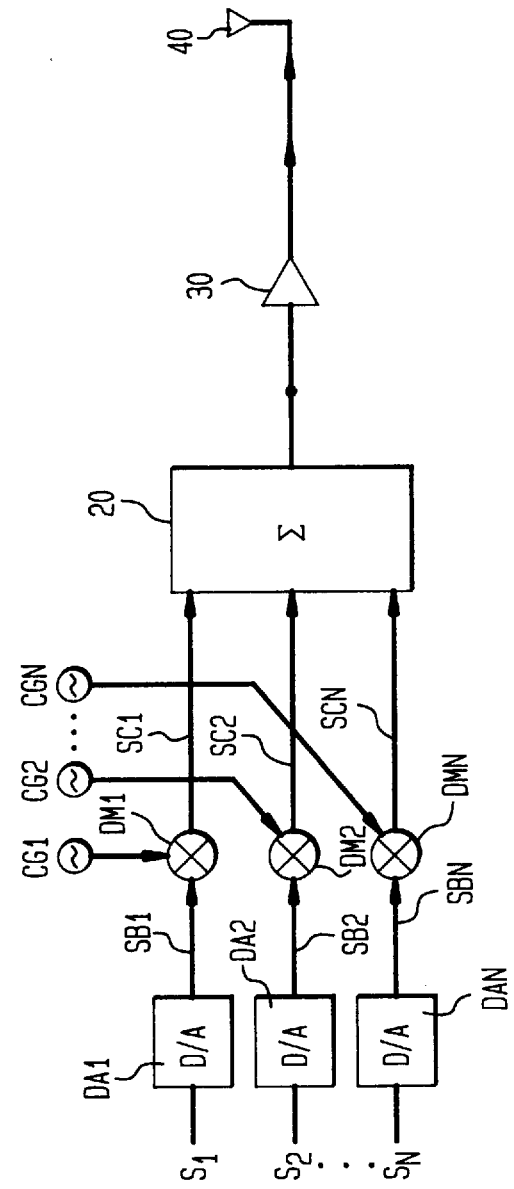
FIG. 1 is a block diagram of a conventional amplifier system.
Figure 2:
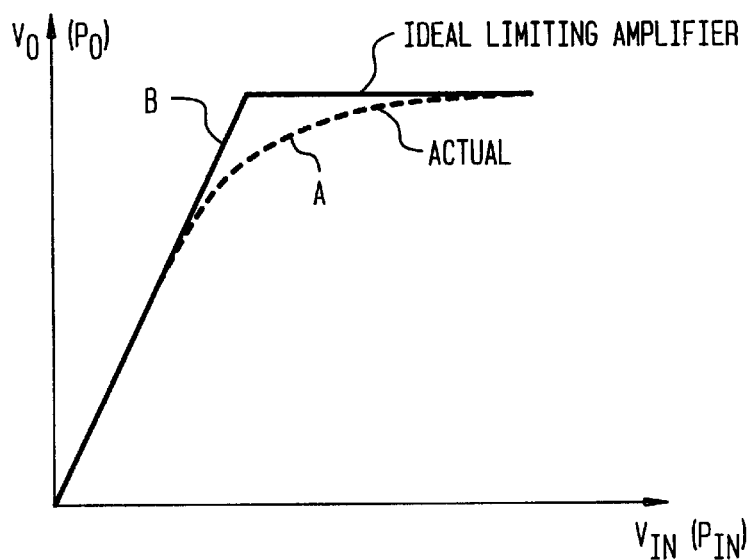
FIG. 2 is a waveform diagram of the transfer characteristic of an amplifier.
Figure 3A:
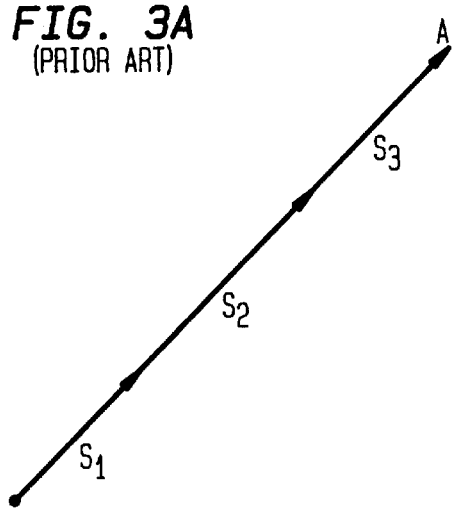
FIG. 3A illustrates "peaking" with signal phasers adding in phase.
Figure 3B:
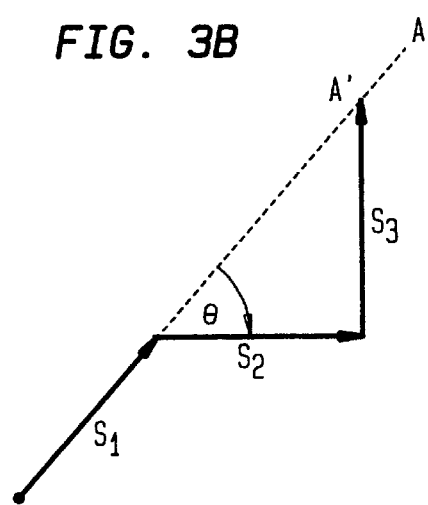
FIG. 3B illustrates reduction in "peaking" with phase shifts added to some of the input signals.

When differential phase shift keyed (DPSK) modulation with differential detection with framed data is employed, signal processor 10 generates the digital weight signals so that the resulting initial phase shift of each of the baseband digital signals at the start of each time slot results in reduced peaking over the slot. Note that IS-54 is a time division multiple access (TDMA) system having six time slots per frame in which one of 162 symbols may be placed. More particularly, given the symbols for each of the carriers during a particular time slot, the phase of each of the symbols may be shifted by a fixed amount for each carrier to eliminate a peak (assuming the peak is sparse). Alternatively, in accordance with this aspect of the invention, the phase of each of the symbols may be shifted to reduce peaking and the resultant intermodulation products. Note that the amplitude of the symbols can also be adjusted to make the amplifier approximate an ideal limiting amplifier, as shown in FIG. 2.

Figure 7:
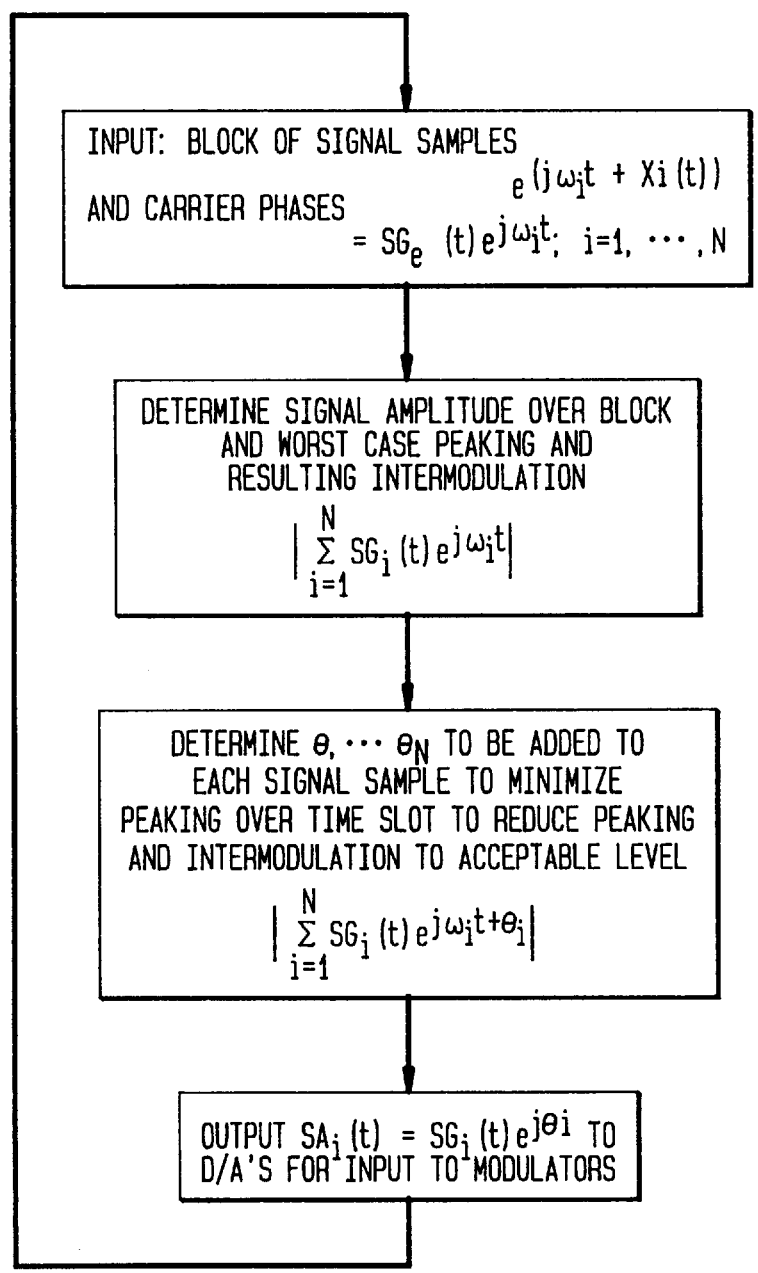
FIG. 7 is a flow chart illustrating one method in accordance with the invention.

The method of adjusting the phase of the signals is best explained with reference to the flow chart shown in FIG. 7, which is briefly discussed below.

1. There is inputted or made available to the processor a block of signal samples representing N input signals and information as to carrier phases for the entire time slot. The modulated signals may be represented as follows:

$$e^{j(\omega_i t + \alpha_i t)} = SG_i(t)e^{j\omega_i t} \text{ for pi } i=1 \text{ through } N,$$

where:

$\omega_i$=frequency of modulation $\alpha_i$=phase modulation $SG_i$ represents the baseband input signal 2. The processor determines the amplitude of the composite signal (CS) for the block of data and the worst case peaking, and the resultant intermodulation.

$$CS = [SG_1(t)e^{j\omega_1 t} + \ldots + SG_N(t)e^{j\omega_N t}] = \sum_{i=1}^{N} SG_i(t)e^{j\omega_i t}$$

3. The processor then functions to find the values of phase shifts ($\theta_1 \ldots \theta_N$) to add to the signals to reduce peaking and intermodulation to an acceptable level. These values of phase shift are fixed over the time slot. The resultant signals are then $$SG_i(t)e^{j\omega_i t + \theta_i}; \ i=1,N \text{ over this time slot}.$$

Note that for differential detection, the added phase shift does not affect the received signal detection. Note also that the amplitude of the composite signal at each sample can also be adjusted so that the amplifier looks like an ideal limiting amplifier.

According to another aspect of the invention, to avoid adding undesirable modulation in the transmitted composite signal for either analog FM (AMPS) or digital signals, a phase shift is slowly added to each of the baseband signals over a long interval. In accordance with this aspect of the invention, a small phase shift may be added to each symbol to eliminate different peaking events. The phase shifts must be small enough so as not to significantly affect the received signal detection. The phase shift may be added incrementally and continuously over the time period the data block is being operated on the signal processor 10.

Figure 8:
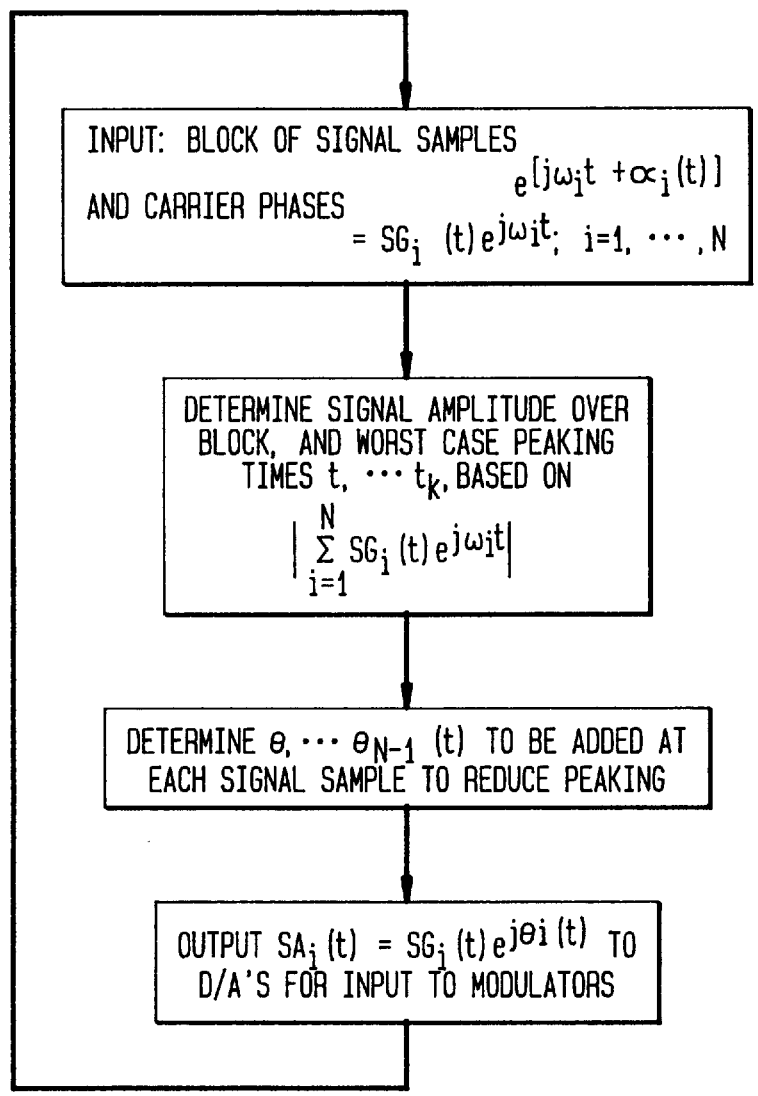
FIG. 8 is a flow chart illustrating another method embodying the invention.

This method is best explained with reference to the flow chart shown in FIG. 8. In FIG. 8 (as in FIG. 7) there is inputted or made available to the processor a block of signal samples representing the N baseband input signals, as well as carrier phase information. Note that, as compared to the first method, the block of samples may not necessarily correspond to a time slot. The processor then determines the signal amplitude over the block of data and the worst case peaking and corresponding instants of time. The processor also determines the extent of the peaking and the resultant intermodulation which would be produced at the output of the amplifier.

Based on predetermined limits of allowable intermodulation, the processor then searches for the values of phase shift ($\theta_i$) to be added to each signal sample to reduce peaking and intermodulation to an acceptable level. When the search is complete, signal processor 10 generates the modified signals (SAi) or weights (Wi) which are then combined with the input signals (Si) to produce the desired modified signals SAi.

The phase adjustment to the baseband signals as taught herein may also be explained as follows.

Unmodulated carrier wave signals may be expressed generally as:

$$e^{j\omega_i t};$$

and for a system with three carriers, the expression would be:

$$e^{j\omega_1 t};\ e^{j\omega_2 t};\ e^{j\omega_3 t}.$$

The peak power for the three carrier wave signals may be expressed as follows:

$$A\ peak = Max_t[e^{j\omega_1 t} + e^{j\omega_2 t} + e^{j\omega_3 t}]$$

Gans teaches that the addition of a fixed phase shift ($\theta 2$ and $\theta 3$) to the unmodulated carrier signals, such that A peak is reduced where A peak1 may be expressed as follows:

$$A\ peak1 = Max_t[e^{j\omega_1 t} + e^{(j\omega_2 t + \theta_2)} + e^{(j\omega_3 t + \theta_3)}]$$

However, for signals S1, S2 and S3, modulating their respective carrier wave signals CW1, CW2 and CW3, the modulated signals (SCi in FIG. 5) at the output of the modulators MDi may be expressed as follows:

$$SC1 = e^{[j\omega_1 t + \alpha_1(t)]}$$

$$SC2 = e^{[j\omega_2 t + \alpha_2(t)]}$$

$$SC3 = e^{[j\omega_3 t + \alpha_3(t)]}$$

where the $\alpha_i$'s which represent phase modulation are arbitrary.

It is virtually impossible to determine values of phase shift (e.g., $\theta_1$, $\theta_2$ and $\theta_3$) to be added to the signals over all time to reduce peaking and resultant intermodulation. However, Applicant recognized that where, over a short period of time, the values of $\alpha_1(t)$, $\alpha_2(t)$, $\alpha_3(t)$ are known, then for this certain short time period, values of phase shift $\theta_1$, $\theta_2$ and $\theta_3$ can be found to reduce peaking.

The phase shift must then be added in such a way so as not to change the input (received) signal significantly, since each input signal depends on $\alpha_i$.

In accordance with the first method, discussed above, which is particularly useful in differential phase shift keyed (DPSK) modulation for TDMA, the phase shift ($\theta_1$, $\theta_2$, $\theta_3$) is set and held constant in each time slot to reduce intermodulation over the time slot.

In accordance with the second method, also discussed above, phase shifts to reduce peaking and intermodulation are added gradually over time to the signals being propagated. For an example case of peaking at time t=K and t=M, this is best explained by assuming that:

a) initially at time t=0, $\theta_2$ and $\theta_3$ are zero;

b) at a later time t=K, $\theta_2$ and $\theta_3$ should respectively have values of $\theta_2(K)$ and $\theta_3(K)$; and c) at a still later time t=M, $\theta_2$ and $\theta_3$ should respectively have values of $\theta_2(M)$ and $\theta_3(M)$.

then:

1) For any time (i) between t=0 and t=K, the value of $\theta_2$ for any time i may be made to vary linearly such that $\theta_2(i) = [i/K]\theta_2 K$ and the value of $\theta_3(i)$ at any time i should also be made to vary linearly such that $$\theta_3(i) = [i/K]\theta_3(K)$$

2) For any time (i) period between t=K and t=M, $$\theta_2(i) = [(i-K)/(M-K)][\theta_2(M) - \theta_2(K)] + \theta_2(K),$$

and $$\theta_3(i) = [(l-K)/(M-K)][\theta_3(M) - \theta_3(K)] + \theta_3(K)$$

Thus, in this method, the phase shift is gradually changed over the time interval during which the signal is to be transmitted.

This method may also include, in addition to the added phase shifts, modifying the amplitude of the signal input to the amplifier so that it looks like an ideal limiting amplifier.

The foregoing merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A system for reducing the peaking of multiple carrier modulated signals applied to the input of an amplifier and the resultant intermodulation, produced at the output of the amplifier, comprising:

N input terminals, where N is an integer greater than one;

means for applying a different one of N baseband input signals to each of said N input terminals;

a signal processing means;

an amplifier having an input and an output;

means for supplying said N different baseband input signals to said signal processing means including memory storage elements for storing blocks of baseband input signal data and for selectively supplying said blocks of data to said signal processing means; said signal processing means for sensing the amplitude and phase of all of the N baseband input signals and, in response thereto, producing N modified signals, each modified signal corresponding to one of said N baseband input signals with the phase of selected ones of the N baseband signals being modified to reduce peaking at the input of the amplifier;

means for coupling said N modified signals to respective ones of N carrier modulators for producing N carrier waves modulated by said N modified signals; and means for summing the N carrier waves modulated by the N modified signals and producing a composite signal applied to the input of said amplifier for producing at its output an amplified composite signal having less intermodulation and distortion than if the N baseband input signals had been applied without modification to their corresponding carrier modulators.

2. A system as claimed in claim 1, wherein said signal processing means includes a digital signal processor for digitally modifying the phase of the N baseband input signals.

3. A system as claimed in claim 2, wherein said means for applying said N modified signals to respective carrier modulators includes N digital-to-analog converters (DACs) coupled between the modified signals and their corresponding modulators.

4. A system as claimed in claim 1, wherein said amplifier consists of a single power amplifier and wherein the output of said amplifier is supplied to an antenna for transmission.

5. A system as claimed in claim 1, wherein said signal processing means includes a signal processor and N multipliers;

wherein said signal processor generates N different weighting factors, one per baseband input signal; and each multiplier for multiplying a weighting factor with a corresponding baseband input signal for producing said N modified signals.

6. A method for reducing the peaking of multiple carrier modulated signals applied to the input of an amplifier and the resultant intermodulation produced at the output of the amplifier comprising the steps of:

applying N baseband input signals to a processing means including the storing of blocks of said N baseband input signals and selectively supplying said blocks of data to said processing means for modifying the phase of selected ones of the N baseband input signals and for producing N modified signals, each modified signal corresponding to one of said N baseband input signals;

applying each one of said N modified signals to a different one of N modulators, each modulator having a carrier signal applied to it, for modulating each carrier signal by one of said N modified signals and for producing N carrier signals modulated by said N modified signals; and combining said N carrier signals modulated by said modified signals to produce a composite signal and applying the composite signal to the input of the amplifier.

7. A method as claimed in claim 6 further including the step of applying the output of the amplifier to an antenna for transmission.

8. A method as claimed in claim 6 wherein said processing means comprises a digital signal processor.

9. A method as claimed in claim 6 wherein the application of the N baseband input signals to a processing means for modifying at least one of the phase and amplitude of the N baseband input signals includes the application of a fixed phase shift over a fixed time period to each signal.

10. A method as claimed in claim 6 wherein the application of the N baseband input signals to a processing means for modifying at least one of the phase and amplitude of the N baseband input signals includes the application of an incremental continuous phase shift to each signal over an extended time period.

11. An apparatus for reducing intermodulation products resulting from the coupling of N modulated carriers to the input of an amplifier comprising:

N input terminals, each terminal for the application thereto of a different one of N baseband input signals; where N is an integer greater than one;

a signal processing means;

means for supplying said N different baseband input signals to said signal processing means for sensing the amplitude and phase of the N baseband input signals and, in response thereto, modifying the phase of selected ones of the N baseband signals to reduce peaking resulting from the phase alignment of the input signals, and for producing N modified signals, each modified signal corresponding to one of said N baseband input signals; wherein said means for supplying said N different baseband input signals to said signal processing means includes memory storage elements for storing blocks of baseband input signal data and for selectively supplying said blocks of data to said signal processing means;

means for coupling each one of the N modified signals to a different carrier modulator for producing N carrier wave signals modulated by said N modified signals and means for summing these signals and producing a composite signal; and means for applying the composite signal to the input of said amplifier for producing at its output an amplified composite signal corresponding to said N baseband input signals having a low degree of intermodulation and distortion.

12. An apparatus as claimed in claim 11 wherein said signal processing means includes a signal processor and N multipliers;

wherein said signal processor generates N different weighting factors, one per baseband input signal; and each multiplier for multiplying a weighting factor with a corresponding baseband input signal for producing said N modified signals.

13. A system for reducing the peaking of N carrier modulated signals applied to the input of an amplifier and the resultant intermodulation produced at the output of the amplifier, comprising:

N input terminals, each terminal for receiving a different one of N baseband input signals;

a signal processing means;

an amplifier having an input and an output;

means coupled between said N terminals and said signal processing means for supplying said N different baseband input signals to said signal processing means including memory storage elements for storing blocks of baseband input signal data and for selectively supplying said blocks of data to said signal processing means; said signal processing means for sensing the amplitude and phase of all the N baseband input signals and, in response thereto, producing N modified signals, each modified signal corresponding to one of said N baseband input signals with the phase of selected ones of the N baseband signals being modified to reduce peaking of the signals when they are eventually combined at the input of the amplifier;

N carrier modulators;

means for coupling said N modified signals to respective ones of said N carrier modulators for producing N carrier waves modulated by said N modified signals; and means coupled to said N carrier modulators for summing the N carrier waves modulated by the N modified signals and producing a composite signal applied to the input of said amplifier for producing at the output of said amplifier an amplified composite signal having less intermodulation and distortion than if the N baseband input signals had been applied without modification to their corresponding carrier modulators.

* * * * *